(12) United States Patent
Kitamura

(10) Patent No.: US 6,174,792 B1
(45) Date of Patent: Jan. 16, 2001

(54) METHOD OF MANUFACTURING A SEMICONDUCTOR DEVICE

(75) Inventor: Akio Kitamura, Nagano (JP)

(73) Assignee: Fuji Electric Co., Ltd., Kawasaki (JP)

( * ) Notice: Under 35 U.S.C. 154(b), the term of this patent shall be extended for 0 days.

(21) Appl. No.: 09/110,180

(22) Filed: Jul. 6, 1998

(30) Foreign Application Priority Data

Jul. 16, 1997 (JP) .................................................... 9-191388

(51) Int. Cl.$^7$ ................................................. H01L 21/4763

(52) U.S. Cl. ........................................... 438/585; 438/425

(58) Field of Search ..................................... 438/425, 431, 438/439, 445, 446, 448, 297, 299

(56) References Cited

U.S. PATENT DOCUMENTS 5,248,350 * 9/1993 Lee ....................................... 148/33.2

FOREIGN PATENT DOCUMENTS 61-244041 10/1986 (JP) .

* cited by examiner

Primary Examiner—David Nelms
Assistant Examiner—Quoc Hoang
(74) Attorney, Agent, or Firm—Kanesaka & Takeuchi

(57) ABSTRACT

A semiconductor device is manufactured by forming a gate oxide film on a semiconductor substrate; forming a gate electrode on the gate oxide film; forming a first nitride film on the gate electrode; etching the gate electrode and the first nitride film through a same mask; depositing a second nitride film on at least a side wall of the gate electrode for covering the same; forming an opening in the second nitride film by etching such that the second nitride film is left on the side wall of the gate electrode; and forming a thick oxide film, i.e. LOCOS film, on a bottom of the opening in the second nitride film by a thermal oxidation. The alignment mismatch between the LOCOS film and the gate electrode is prevented, and the overlap length of the LOCOS film and the gate electrode is shortened to a half or less of the overlap length in the conventional device.

11 Claims, 5 Drawing Sheets

METHOD OF MANUFACTURING A SEMICONDUCTOR DEVICE

BACKGROUND OF THE INVENTION AND RELATED ART STATEMENT

The present invention relates to a method of manufacturing a semiconductor device such as a power IC which includes lateral unit structures with high breakdown voltage. More specifically, the present invention relates to a method of manufacturing a semiconductor device which exhibits a breakdown voltage of 20 V or more.

In many conventional power IC's, a plurality of high-breakdown-voltage devices are integrated on one single chip. In the high-breakdown-voltage device, a drain side portion of a gate electrode is extended onto a LOCOS (local oxidation of silicon) film for device separation to relax the electric field localization below the drain-side edge of the gate electrode.

Recently, the structure of each high-breakdown-voltage device integrated on a chip has become so fine that the size of the constituent device affects greatly the down-sizing of the chip. When the LOCOS film for electric field relaxation is formed through an exclusive mask, an alignment mismatch of around 0.3 µm is caused between the LOCOS film and the gate electrode, and the LOCOS film is elongated by the alignment mismatch. When the device pitch (distance between the source and the drain) is 4 µm, for example, the chip size increases to 4.3 µm, i.e. around 8% (0.3 µm+4 µm).

FIG. 11 is a cross section of a main portion of a conventional lateral type DMOSFET with a high breakdown voltage. Here, the DMOSFET strands for "dual diffusion metal oxide semiconductor field effect transistor".

Referring now to FIG. 11, a p-type base region 23 and an n-type offset region 21 are formed in the surface portion of a p-type silicon substrate 1. An n-type source region 24 is formed in the surface portion of the p-type base region 23. A polysilicon gate electrode 27a is formed above the p-type base region 23 and the p-type silicon substrate 1 between the n-type source region 24 and the n-type offset region 21 with a gate oxide film 2 interposed inbetween. The gate electrode 27a is extended onto a part of a LOCOS film 6a formed on the n-type offset region 21. An n-type drain region 22 and a drain electrode 25 are formed on the right hand side of the n-type offset region 21. Since LOCOS film 6a and gate electrode 27a are patterned through individual or different masks, the foregoing patterning mismatch (alignment mismatch) occurs. Due to the alignment mismatch, the overlap length D of the gate electrode 27a and LOCOS film 6a is elongated. As the overlap length D becomes longer, it is necessary to elongate the LOCOS film 6a for obtaining the design value of the breakdown voltage. As the device structure becomes finer as described above, the alignment mismatch can not be ignored. The device pitch (distance between the source and the drain) W becomes longer by the increment of the length of the LOCOS film 6. The elongated device pitch enlarges the chip size.

As described above, the conventional technique causes the alignment mismatch as the device structure becomes finer. The alignment mismatch further causes the chip size increase.

In view of the foregoing, it is an object of the invention to provide a method of manufacturing a lateral type semiconductor device which facilitates shortening the device pitch without enlarging the chip size.

SUMMARY OF THE INVENTION

According to an aspect of the invention, there is provided a method of manufacturing a semiconductor device, the method including the steps of: forming a gate oxide film on a semiconductor substrate; forming a gate electrode on the gate oxide film; forming a first nitride film on the gate electrode; etching the gate electrode and the first nitride film through a same mask; depositing a second nitride film for covering at least a side wall of the gate electrode; forming an opening in the second nitride film by anisotropic etching such that the second nitride film is left on the side wall of the gate electrode; and forming a thick oxide film in the bottom of the opening in the second nitride film by thermal oxidation.

The alignment mismatch between the gate electrode and the oxide film for the electric field relaxation is prevented by forming the gate electrode and the oxide film through the same mask. The first nitride film is deposited to prevent the gate electrode of polysilicon from being oxidized. And, the second nitride film left on the side wall of the gate electrode by anisotropic etching also prevents the gate electrode from being oxidized.

Advantageously, the thick oxide film is a LOCOS film for device separation.

By employing the LOCOS technique, a thick oxide film is obtained without adding any manufacturing step of thickening an oxide film. The semiconductor device according to the invention is of a lateral type.

Advantageously, the thick oxide film is formed for relaxing the electric field below the drain-side edge of the gate electrode.

DETAILED DESCRIPTION OF PREFERRED EMBODIMENTS

Now the present invention will be described hereinafter with reference to the accompanying drawings which illustrate the preferred embodiments of the invention.

FIGS. 1 through 9 are cross sectional views illustrating the manufacturing steps of a semiconductor device according to the embodiment of the invention.

Figure 1:
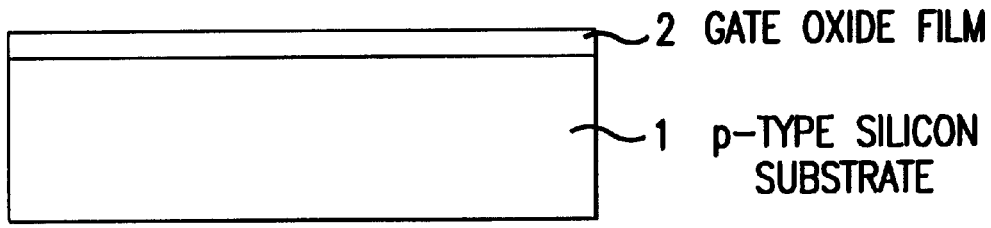
FIGS. 1 through 9 are cross sectional views illustrating the manufacturing steps of a semiconductor device according to an embodiment of the invention.
Figure 2:
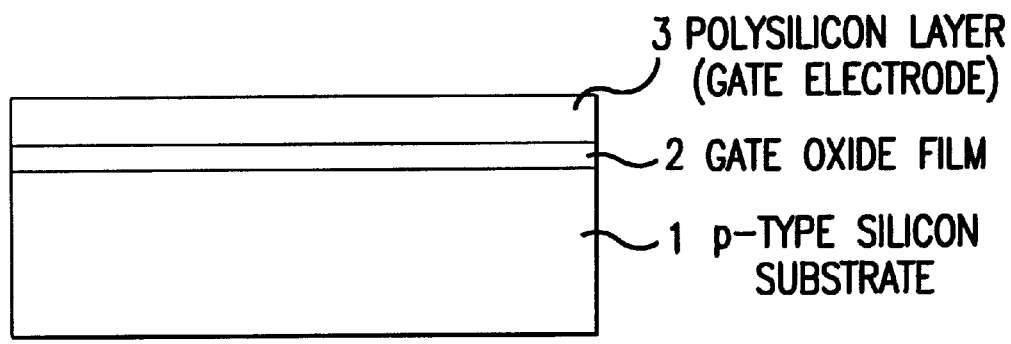
Figure 3:
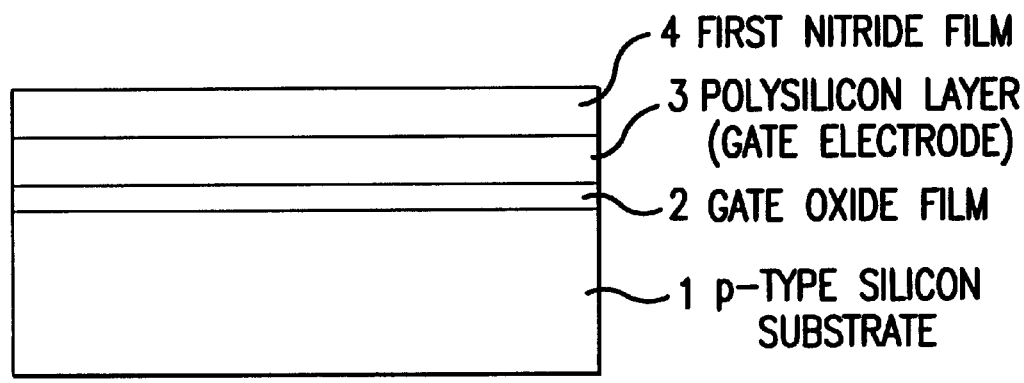
Figure 4:
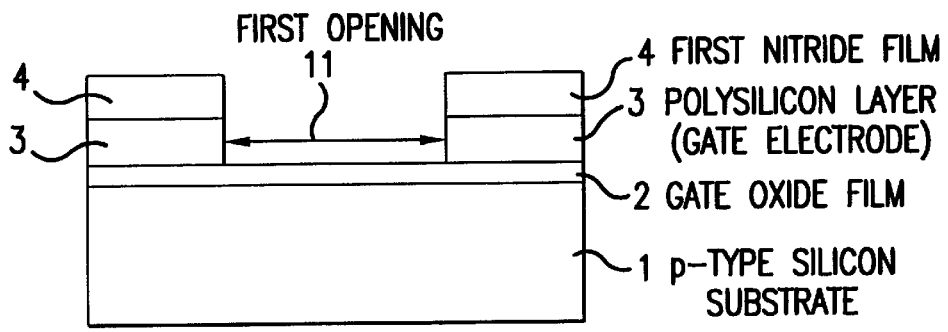
Figure 5:
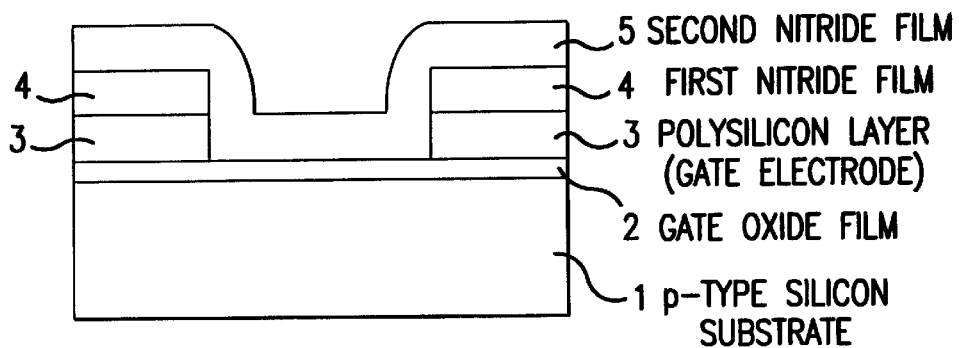
Figure 6:
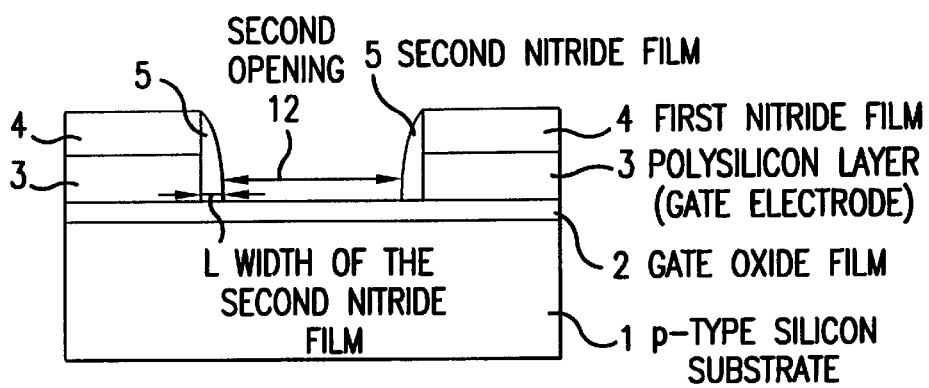

In FIG. 1, a gate oxide film 2 of 200 Å in thickness is formed on a p-type silicon substrate 1. In FIG. 2, a polysilicon layer 3 of 3000 Å in thickness for a gate electrode is formed on the gate oxide film 2. In FIG. 3, a first nitride film 4 of 3000 Å in thickness is deposited on the polysilicon layer 3. In FIG. 4, the polysilicon layer 3 and the first nitride film 4 are etched with a LOCOS film forming pattern such that a first opening is formed. In FIG. 5, a second nitride film 5 of 1000 Å in thickness is deposited such that the second nitride film 5 covers at least the polysilicon layer 3. In FIG. 6, the second nitride film 5 is etched by an anisotropic etching. After the anisotropic etching, the etched surface of the polysilicon layer 3 is still covered with the second nitride film 5, but the surface of the gate oxide film 2 is exposed to a second opening 12. The width L of the second nitride film 5 in the form of a spacer (similar to the spacer used in a LDD-MOS), is 1000 Å or less.

Figure 7:
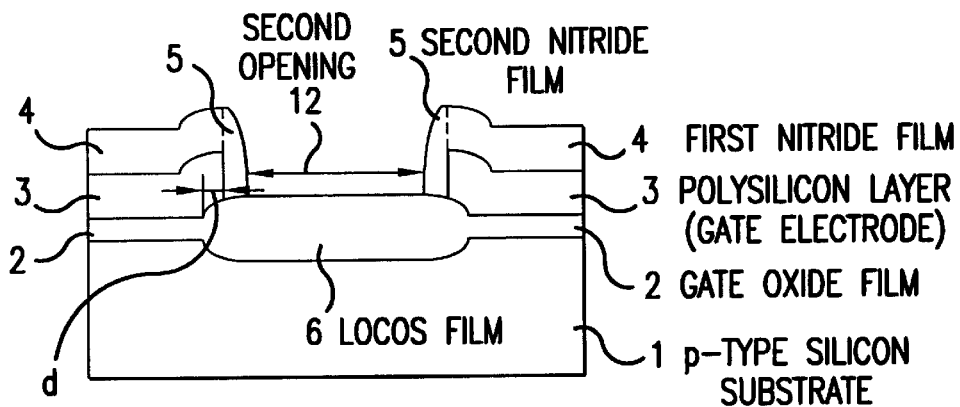
Figure 8:
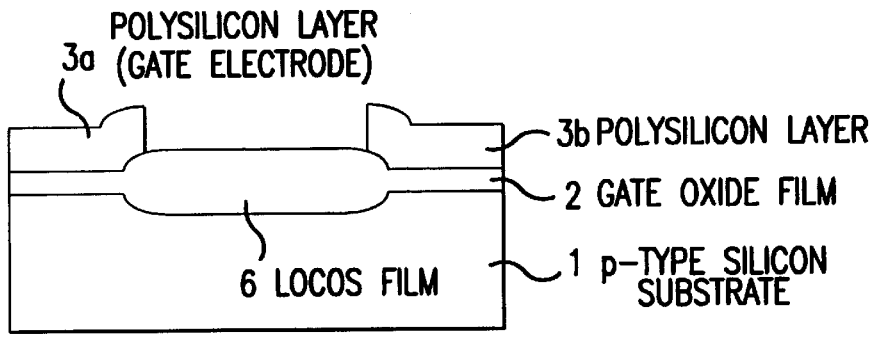
Figure 9:
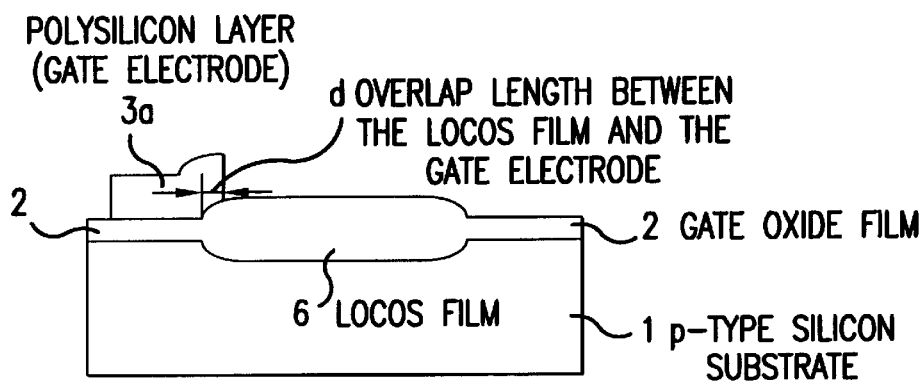

After protecting the exposed surface of the polysilicon layer 3 as shown in FIG. 6, a LOCOS film of 6000 Å in thickness is formed by using the protected polysilicon layer 3 as a mask as shown in FIG. 7. The distance d between the polysilicon layer 3 and the LOCOS film 6 is determined by the variation of the width L caused by the variation of the etching condition. When the LOCOS film of 6000 Å in thickness is formed, its bird's beak, i.e. length of a gradually thinning portion of the LOCOS film, is around 0.5 $\mu$m. Therefore, the LOCOS film 6 is sufficiently extended deeply below the polysilicon layer 3. Then, a polysilicon self-alignment film, that is the LOCOS film 6, is left as shown in FIG. 8 by removing the first and second nitride films 4 and 5. Then, a polysilicon layer 3b, not used as a gate electrode, and a portion of a polysilicon layer 3a used as a gate electrode and located at the opposite side of the LOCOS film 6 are removed by etching as shown in FIG. 9. An n-type substrate may be used without problems for the substrate 1.

Figure 10:
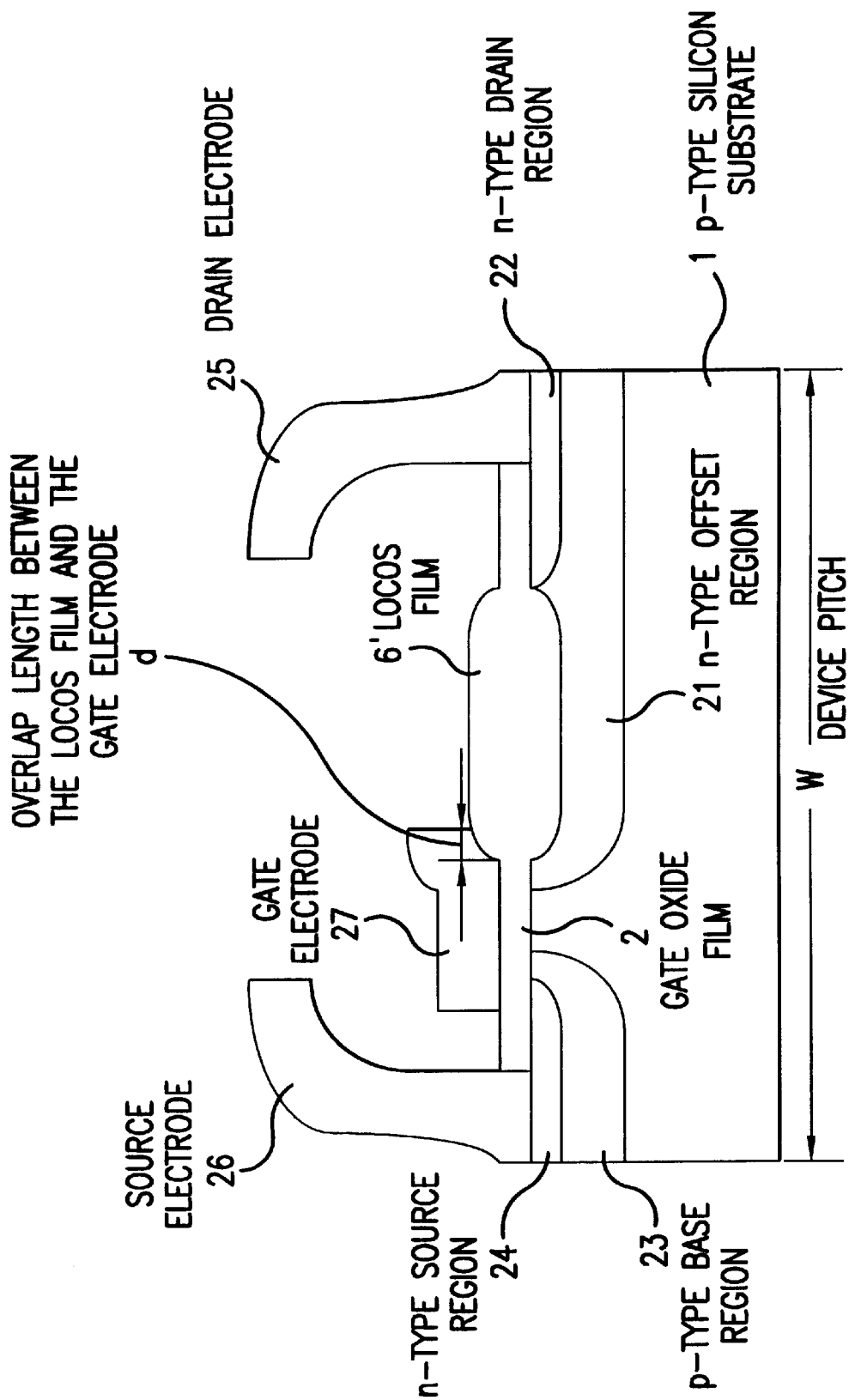
FIG. 10 is a cross sectional view of a main portion of a lateral type semiconductor device exhibiting a high breakdown voltage according to another embodiment of the invention.

FIG. 10 is a cross sectional view of the main portion of a lateral type semiconductor device exhibiting a high breakdown voltage according to another embodiment of the invention.

Figure 11:
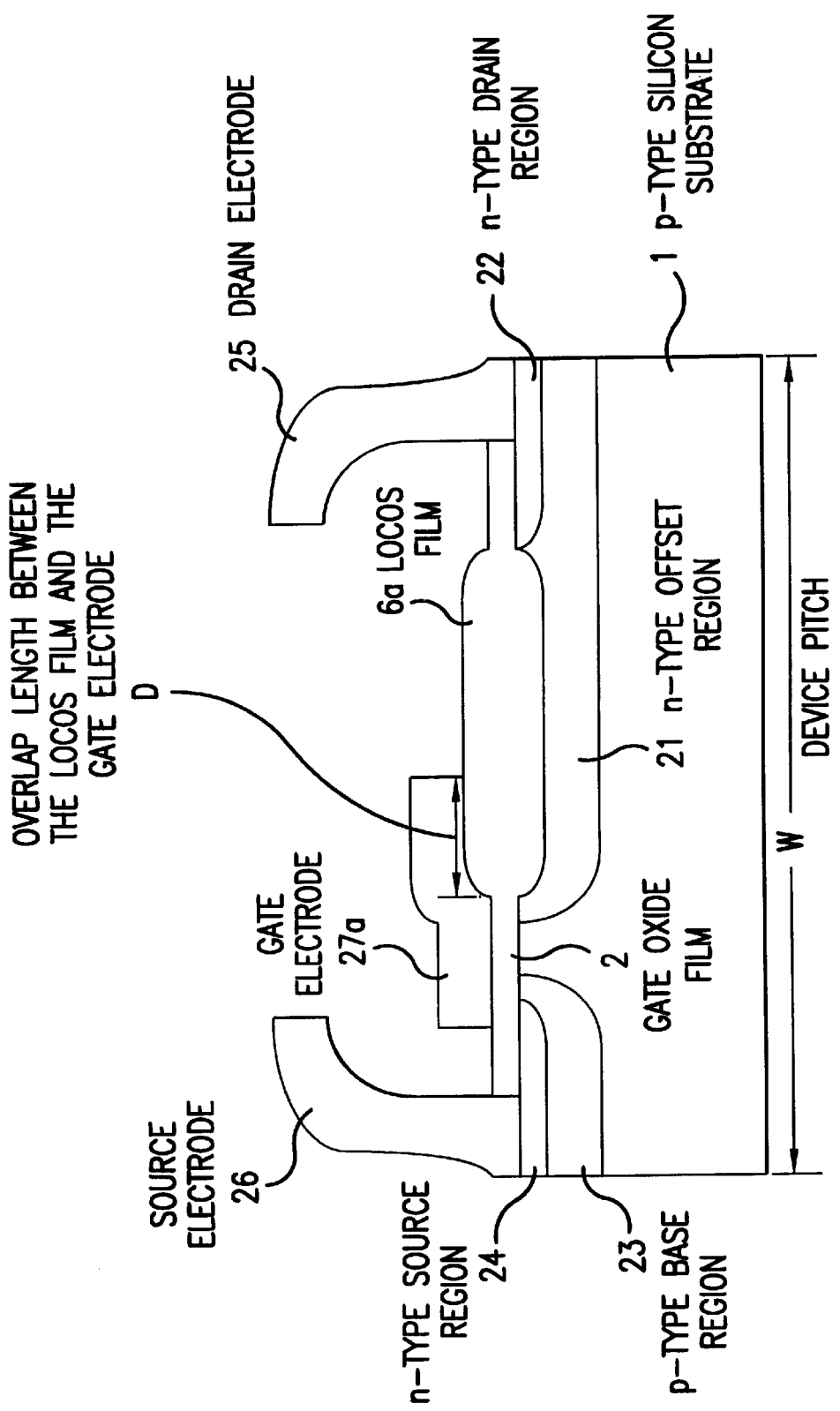
FIG. 11 is a cross sectional view of a main portion of a conventional lateral type DMOSFET with a high breakdown voltage.

Referring now to FIG. 10, a LOCOS film 6' is formed on an n-type offset region 21, in contrast to the LOCOS film 6 formed on the p-type silicon substrate 1 in FIGS. 1 through 9. The lateral type semiconductor device of FIG. 10 is different from the conventional lateral type semiconductor device of FIG. 11 in that the LOCOS film 6' of FIG. 10 on the n-type offset region 21 is patterned simultaneously with the patterning of a gate electrode 27. Therefore, in the lateral type semiconductor device of FIG. 10, any alignment mismatch is not caused between the LOCOS film and the gate electrode, and the overlap length d of the LOCOS film and the gate electrode is half or less than the overlap length in the conventional device. In other words, the LOCOS film 6' of FIG. 10 is formed by the self-alignment, while the LOCOS film 6a of FIG. 11 is not. According to the invention, the gate length is shortened to 1.0 $\mu$m, the oxide film width to 0.6 Mm and the device pitch (distance between the source and the drain) w from 4.3 $\mu$m to 4.0 $\mu$m.

According to the invention, dislocation or misalignment of the gate electrode and the LOCOS film is prevented by employing the self-alignment technique. As a result, the gate length, and therefore, the device pitch is shortened, and the chip size is reduced.

What is claimed is:

1. A method of manufacturing a semiconductor device comprising:

forming a gate oxide film on a semiconductor substrate;

forming a gate electrode on the gate oxide film;

forming a first nitride film on the gate electrode;

etching the gate electrode and the first nitride film through a same mask to expose the gate oxide film on the substrate;

depositing a second nitride film on at least the gate oxide film and a side wall of the gate electrode for covering the same;

forming an opening in the second nitride film by an anisotrophic etching such that the second nitride film is left on the side wall of the gate electrode directly above a part of the gate oxide film, and a part of the gate oxide film is exposed in the opening; and forming a thick oxide film in the gate oxide film at a bottom of the opening by a thermal oxidation so that a thinning portion of the thick oxide film is formed under the gate electrode as an overlapping portion with reference to the second nitride film on the side wall, to thereby form the overlapping portion precisely.

2. A method according to claim 1, wherein the thick oxide film is a LOCOS film for device separation.

3. A method according to claim 1, wherein the thick oxide film is formed for relaxing an electric field below a drain-side edge of the gate electrode.

4. A method according to claim 1, wherein said depositing the second nitride film on at least the side wall includes depositing the second nitride film on the first nitride film, the gate oxide film, a side wall of the first nitride wall and the side wall of the gate electrode.

5. A method according to claim 4, wherein said thick oxide film extends under the second nitride film toward the thinning portion.

6. A method according to claim 5, further comprising removing the first and second nitride films after the thick oxide film is formed.

7. A method of manufacturing a semiconductor device comprising:

forming a gate oxide film on a semiconductor substrate;

forming a polysilicon layer for a gate electrode on the gate oxide film;

forming a first nitride film on the polysilicon layer;

etching the polysilicon layer and the first nitride film by a same mask to form an opening for exposing a part of the gate oxide film;

depositing a second nitride film on the first nitride film, the part of the gate oxide film and side walls of the first nitride film and the polysilicon layer at a side of the opening;

removing the second nitride film by etching such that the second nitride film is left on the side walls of the first nitride film and the polysilicon layer; and forming a LOCOS film in the gate oxide film located at a bottom of the opening, said LOCOS film having a thick portion with a thickness greater than that of the gate oxide film and a thinning portion extending from the thick portion to the gate oxide film to form a partial overlapping portion under the polysilicon layer with reference to the second nitride film on the side walls to thereby form the overlapping portion precisely.

8. A method according to claim 7, further comprising removing the first nitride film and the polysilicon layer except for a portion for constituting the gate electrode after the LOCOS film is formed.

9. A method according to claim 7, wherein the etching for removing the second nitride film is an anisotrophic etching.

10. A method according to claim 7, wherein said thick oxide film extends under the second nitride film toward the thinning portion.

11. A method according to claim 10, further comprising removing the first and second nitride films after the thick oxide film is formed.

* * * * *